United States Patent
Liu et al.

(10) Patent No.: US 8,053,760 B2
(45) Date of Patent: Nov. 8, 2011

(54) THIN FILM TRANSISTOR

(75) Inventors: Chang-Hong Liu, Beijing (CN); Kai-Li Jiang, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 118 days.

(21) Appl. No.: 12/384,238

(22) Filed: Apr. 2, 2009

(65) Prior Publication Data

US 2009/0321718 A1 Dec. 31, 2009

(30) Foreign Application Priority Data

May 14, 2008 (CN) .......................... 2008 1 0067161

(51) Int. Cl.
*H01L 29/786* (2006.01)

(52) U.S. Cl. ........... 257/24; 257/E29.069; 257/E29.072; 257/E29.273

(58) Field of Classification Search .................... 257/24, 257/E29.069, E29.072, E29.273
See application file for complete search history.

(56) References Cited

U.S. PATENT DOCUMENTS

| | | | |
|---|---|---|---|
| 6,423,583 B1 | 7/2002 | Avouris et al. |
| 6,814,832 B2 | 11/2004 | Utsunomiya |
| 6,899,945 B2 | 5/2005 | Smalley et al. |
| 6,921,575 B2 | 7/2005 | Horiuchi et al. |
| 7,051,945 B2 | 5/2006 | Empedocles et al. |
| 7,253,431 B2 | 8/2007 | Afzali-Ardakani et al. |
| 7,285,501 B2 | 10/2007 | Mardilovich et al. |
| 7,323,730 B2 | 1/2008 | Borghetti et al. |
| 7,359,888 B2 | 4/2008 | Snider |
| 7,399,400 B2 | 7/2008 | Soundarrajan et al. |
| 7,537,975 B2 | 5/2009 | Moon et al. |
| 7,812,342 B2 | 10/2010 | Lee et al. |
| 7,838,809 B2 | 11/2010 | Ludwig |
| 2002/0163079 A1 | 11/2002 | Awano |
| 2004/0251504 A1 | 12/2004 | Noda |
| 2005/0061496 A1 | 3/2005 | Matabayas, Jr. |

(Continued)

FOREIGN PATENT DOCUMENTS

CN 1484865 3/2004

(Continued)

OTHER PUBLICATIONS

Minko et al. "Two-level structured self-adaptive surfaces with reversibly tunable properties", Journal of American Chemical Society, 125, pp. 3896-3900, 2003.

(Continued)

*Primary Examiner* — Zandra Smith
*Assistant Examiner* — Paul Patton
(74) *Attorney, Agent, or Firm* — Altis Law Group, Inc.

(57) ABSTRACT

A thin film transistor includes a source electrode, a drain electrode, a semiconducting layer, and a gate electrode. The drain electrode is spaced from the source electrode. The semiconducting layer includes a carbon nanotube structure comprised of carbon nanotubes. The gate electrode is insulated from the source electrode, the drain electrode, and the semiconducting layer by an insulating layer. The carbon nanotube structure is connected to both the source electrode and the drain electrode, and an angle exist between each carbon nanotube of the carbon nanotube structure and a surface of the semiconductor layer, and the angle ranges from about 0 degrees to about 15 degrees.

19 Claims, 4 Drawing Sheets

U.S. PATENT DOCUMENTS

| | | |
|---|---|---|
| 2005/0079659 A1 | 4/2005 | Duan et al. |
| 2005/0106846 A1 | 5/2005 | Dubin et al. |
| 2005/0189535 A1 | 9/2005 | Hsueh et al. |
| 2006/0137817 A1 | 6/2006 | Ma et al. |
| 2006/0249817 A1 | 11/2006 | Kawase et al. |
| 2007/0004191 A1 | 1/2007 | Gu et al. |
| 2007/0012922 A1 | 1/2007 | Harada et al. |
| 2007/0029612 A1 | 2/2007 | Sandhu |
| 2007/0069212 A1 | 3/2007 | Saitoh et al. |
| 2007/0085460 A1 | 4/2007 | Harutyunyan et al. |
| 2007/0108480 A1 | 5/2007 | Nanai et al. |
| 2007/0132953 A1 | 6/2007 | Silverstein |
| 2007/0138010 A1 | 6/2007 | Ajayan |
| 2007/0228439 A1 | 10/2007 | Duan et al. |
| 2007/0273796 A1 | 11/2007 | Silverstein et al. |
| 2007/0273797 A1 | 11/2007 | Silverstein et al. |
| 2007/0273798 A1 | 11/2007 | Silverstein et al. |
| 2008/0042287 A1 | 2/2008 | Furukawa et al. |
| 2008/0121996 A1 | 5/2008 | Park et al. |
| 2008/0134961 A1 | 6/2008 | Bao et al. |
| 2008/0173864 A1 | 7/2008 | Fujita et al. |
| 2008/0252202 A1 | 10/2008 | Li et al. |
| 2008/0265293 A1 | 10/2008 | Lee et al. |
| 2008/0277718 A1 | 11/2008 | Ionescu et al. |
| 2009/0042136 A1 | 2/2009 | Tour et al. |
| 2009/0072223 A1 | 3/2009 | Awano |
| 2009/0098453 A1 | 4/2009 | Liu et al. |
| 2009/0159891 A1 | 6/2009 | Daniel et al. |
| 2009/0224230 A1 | 9/2009 | Pesetski et al. |
| 2009/0224292 A1* | 9/2009 | Asano et al. .................. 257/288 |
| 2009/0256594 A1 | 10/2009 | Zhu |
| 2009/0272967 A1 | 11/2009 | Afzali-Ardakani et al. |
| 2009/0282802 A1 | 11/2009 | Cooper et al. |
| 2010/0028613 A1 | 2/2010 | Schmidt et al. |
| 2010/0108988 A1 | 5/2010 | Grebel et al. |
| 2010/0252802 A1 | 10/2010 | Numata et al. |

FOREIGN PATENT DOCUMENTS

| | | |
|---|---|---|
| CN | 1490856 A | 4/2004 |
| CN | 1745468 | 3/2006 |
| CN | 1823426 | 8/2006 |
| CN | 1853268 | 10/2006 |
| JP | 2007-73706 | 3/2007 |
| JP | 2007-123870 | 5/2007 |
| JP | 2009-32894 | 2/2009 |
| WO | WO2004032193 | 4/2004 |
| WO | 2005114708 | 12/2005 |
| WO | WO2006093601 A2 | 9/2006 |
| WO | WO2007089322 | 8/2007 |
| WO | WO2007126412 | 11/2007 |
| WO | WO2008075642 | 6/2008 |

OTHER PUBLICATIONS

Meitl et al., Solution Casting and Transfer Printing Single-Walled Carbon Nanotube Films, Nano Letters, 2004, vol. 4, No. 9.

R E. I. Schropp, B. Stannowski, J. K Rath, New challenges in thin film transistor research, Journal of Non-Crystalline Solids, 299-302, 2002,1304-1310,2002.

Jiang et al. ("Spinning and processing continuous yarns from 4-inch wafer scale super-aligned carbon nanotube arrays", Advanced Materials, 18, pp. 1505-1510, 2006).

IBM research article on IBM research site (enclosed herein, 2004).

Li "Removal of shells of multi-wall carbon nanotubes by repeatedly scanning bias voltage" Science in China Ser. E, Technological Sciences, vol. 47 No. 1 pp. 1-5 (2004).

Ryu "Low-Temperature Growth of Carbon Nanotube by Plasma-Enhanced Chemical Vapor Deposition using Nickel Catalyst". Jpn. J. Appl. Phys. vol. 42, pp. 3578-3581 (2003).

Hines "Nanotransfer printing of organic and carbon nanotube thin-film transistors on plastic substrates", Applied Physics Letters,86,163101 (2005).

\* cited by examiner

THIN FILM TRANSISTOR

RELATED APPLICATIONS

This application is related to commonly-assigned U.S. patent application Ser. No. 12/384,245, entitled, "METHOD FOR MAKING THIN FILM TRANSISTOR", filed Apr. 2, 2009, which is now patented as U.S. Pat. No. 7,754,526; U.S. patent application Ser. No. 12/384,331, entitled, "METHOD FOR MAKING THIN FILM TRANSISTOR", filed Apr. 2, 2009; U.S. patent application Ser. No. 12/384,309, entitled, "THIN FILM TRANSISTOR", filed Apr. 2, 2009; U.S. patent application Ser. No. 12/384,310, entitled, "THIN FILM TRANSISTOR", filed Apr. 2, 2009; U.S. patent application Ser. No. 12/384,244, entitled, "THIN FILM TRANSISTOR PANEL", filed Apr. 2, 2009; U.S. patent application Ser. No. 12/384,329, entitled, "THIN FILM TRANSISTOR", filed Apr. 2, 2009; U.S. patent application Ser. No. 12/384,299, entitled, "THIN FILM TRANSISTOR", filed Apr. 2, 2009; U.S. patent application Ser. No. 12/384,292, entitled, "THIN FILM TRANSISTOR", filed Apr. 2, 2009; U.S. patent application Ser. No. 12/384,281, entitled, "THIN FILM TRANSISTOR", filed Apr. 2, 2009; U.S. patent application Ser. No. 12/384,330, entitled, "THIN FILM TRANSISTOR", filed Apr. 2, 2009; U.S. patent application Ser. No. 12/384,241, entitled, "METHOD FOR MAKING THIN FILM TRANSISTOR", filed Apr. 2, 2009; U.S. patent application Ser. No. 12/384,293, entitled, "THIN FILM TRANSISTOR", filed Apr. 2, 2009. The disclosures of the above-identified applications are incorporated herein by reference.

BACKGROUND

1. Technical Field

The present disclosure relates to thin film transistors and, particularly, to a carbon nanotube based thin film transistor.

2. Discussion of Related Art

A typical thin film transistor (TFT) is made of a substrate, a gate electrode, an insulation layer, a drain electrode, a source electrode, and a semiconductor layer. The thin film transistor performs as a switch by modulating an amount of carriers accumulated at an interface between the insulation layer and the semiconducting layer. The carriers are transit from an accumulation state to a depletion state, causing by applying voltage to the gate electrode. Then, the current is obtained and flows between the drain electrode and the source electrode.

Generally, the material of the semiconductor layer is amorphous silicone (a-Si), poly-silicone (p-Si), or organic semiconducting material. The carrier mobility of an a-Si TFT is relatively lower than a p-Si TFT. However, the method for making the p-Si TFT is complicated and has a high cost. The organic TFT has a virtue of being flexible but has low carrier mobility.

Carbon nanotubes (CNTs) are a novel carbonaceous material and received a great deal of interest since the early 1990s. Carbon nanotubes have interesting and potentially useful heat conducting, electrical conducting, and mechanical properties. Further, there are two kinds of carbon nanotubes: metallic carbon nanotubes and semiconducting carbon nanotubes determined by the arrangement of the carbon atoms therein. The carrier mobility of semiconducting carbon nanotubes along a length direction can reach about 1000 to 1500 $cm^2V^{-1}s^{-1}$. Thus, TFTs employing a semiconductor layer adopting carbon nanotubes have been produced.

However, the carbon nanotubes in the conventional TFT are distributed as a disordered carbon nanotube layer or distributed perpendicular to the substrate as a carbon nanotube array. In the disordered carbon nanotube layer, due to disordered arrangement of the carbon nanotubes, the paths for carriers to travel are relatively long so that low carrier mobility is consequentially resulted. Further, the disordered carbon nanotube layer is formed by printing a mixture of a solvent with the carbon nanotubes dispersed therein on the substrate. The carbon nanotubes in the disordered carbon nanotube layer are joined or combined to each other by an adhesive agent. Thus, the disordered carbon nanotube layer has a loose structure and is not suitable for being used in a flexible TFT.

In the carbon nanotube array, the carbon nanotubes are perpendicular to the substrate. However, although the carbon nanotubes have good carrier mobility along the length direction, the carrier mobility of the carbon nanotube array along a direction parallel to the substrate is relatively low.

In sum, the two kinds of carbon nanotube structures employed in conventional TFTs have low carrier mobility and poor flexibility.

What is needed, therefore, is a TFT in which the above problems are eliminated or at least alleviated.

BRIEF DESCRIPTION OF THE DRAWINGS

Many aspects of the present thin film transistor can be better understood with references to the following drawings. The components in the drawings are not necessarily drawn to scale, the emphasis instead being placed upon clearly illustrating the principles of the present thin film transistor.

Figure 1:
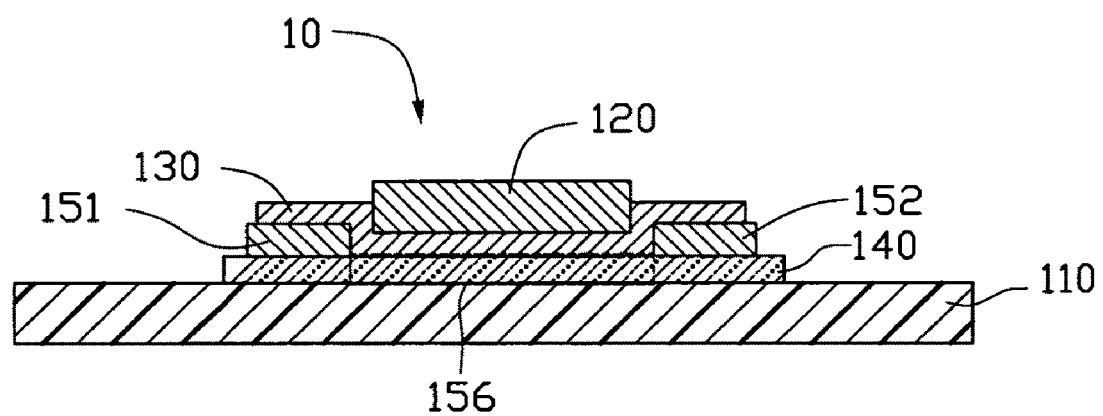
FIG. 1 is a cross sectional view of a thin film transistor in accordance with a first embodiment.

Corresponding reference characters indicate corresponding parts throughout the several views. The exemplifications set out herein illustrate at least one embodiment of the present thin film transistor, in at least one form, and such exemplifications are not to be construed as limiting the scope of the invention in any manner.

DETAILED DESCRIPTION OF EXEMPLARY EMBODIMENTS

References will now be made to the drawings to describe, in detail, embodiments of the present thin film transistor.

Referring to FIG. 1, a thin film transistor 10 is provided in a first embodiment, and has a top gate structure. The thin film transistor 10 includes a semiconductor layer 140, a source electrode 151, a drain electrode 152, an insulating layer 130, and a gate electrode 120. The thin film transistor 10 is located on an insulating substrate 110.

The insulating substrate 110 is provided for supporting the thin film transistor 10. The insulating substrate 110 can be a substrate employed in a printed circuit board (PCB). Alternatively, the insulating substrate 10 can be made of rigid materials (e.g., p-type or n-type silicon, silicon with an silicon dioxide layer formed thereon, crystal, crystal with a oxide layer formed thereon), or flexible materials (e.g., plastic or resin). In the present embodiment, the material of the insulating substrate is glass. The shape and size of the insulating substrate 110 is arbitrary. A plurality of thin film transistors 10 can be assembled on a single insulating substrate 110 according to a designed pattern to be employed in a thin film transistor panel.

The semiconducting layer 140 is located on the insulating substrate 110. The source electrode 151 and the drain electrode 152 are spaced from each other and are both electrically connected to the semiconducting layer 140. The insulating layer 130 is located between the semiconducting layer 140 and the gate electrode 120. The insulating layer 130 is located on a portion of the semiconducting layer 140, or covers the semiconducting layer 140, the source electrode 151, and the drain electrode 152. The gate electrode 120 is located on the insulating layer 130. The insulating layer 130 is configured to electrically insulate the semiconducting layer 140, the source electrode 151, and the drain electrode 152 from each other. A channel 156 is located in the semiconducting layer 140 between the source electrode 151 and the drain electrode 152.

The source electrode 151 and the drain electrode 152 can be located on the semiconducting layer 140 or on the insulating substrate 110. More specifically, the source electrode 151 and the drain electrode 152 can be located on a top surface of the semiconducting layer 140, and located at the same side of the semiconducting layer 140 as the gate electrode 120. In other embodiments, the source electrode 151 and the drain electrode 152 can be located on the insulating substrate 110 and covered by the semiconducting layer 140 (not shown). The source electrode 151 and the drain electrode 152 are located at different sides of the semiconducting layer 140 from the gate electrode 120. In other embodiments, the source electrode 151 and the drain electrode 152 can be formed on the insulating substrate 110, and coplanar with the semiconducting layer 140.

The semiconductor layer 140 includes a carbon nanotube structure comprised of carbon nanotubes. The carbon nanotubes in the carbon nanotube structure are arranged along a same direction or arranged along different directions. The carbon nanotube structure can be connected to the source electrode 151 and the drain electrode 152. The carbon nanotubes in the carbon nanotube structure can rest upon each other. Adjacent carbon nanotubes are attracted to each other and combined by van der Waals attractive force. There is an angle exist between each carbon nanotube of the carbon nanotube structure and a surface of the semiconductor layer, and the angle ranges from about 0 degrees to about 15 degrees. In one embodiment, when the carbon nanotubes in the carbon nanotube structure are arranged along different directions, the carbon nanotube structure can be isotropic. The carbon nanotubes in the carbon nanotube structure are semiconducting carbon nanotubes. The carbon nanotubes can be selected from a group consisting of the single-walled carbon nanotubes, double-walled carbon nanotubes, and combinations thereof. A diameter of the single-walled carbon nanotube is in a range from about 0.5 nanometers to about 50 nanometers. A diameter of the double-walled carbon nanotube is in the range from about 1 nanometer to about 50 nanometers. In the present embodiment, the diameter of the semiconducting carbon nanotube is less than about 10 nanometers. A length of the carbon nanotubes ranges from about 1 micrometer to about 10 millimeters.

Figure 2:
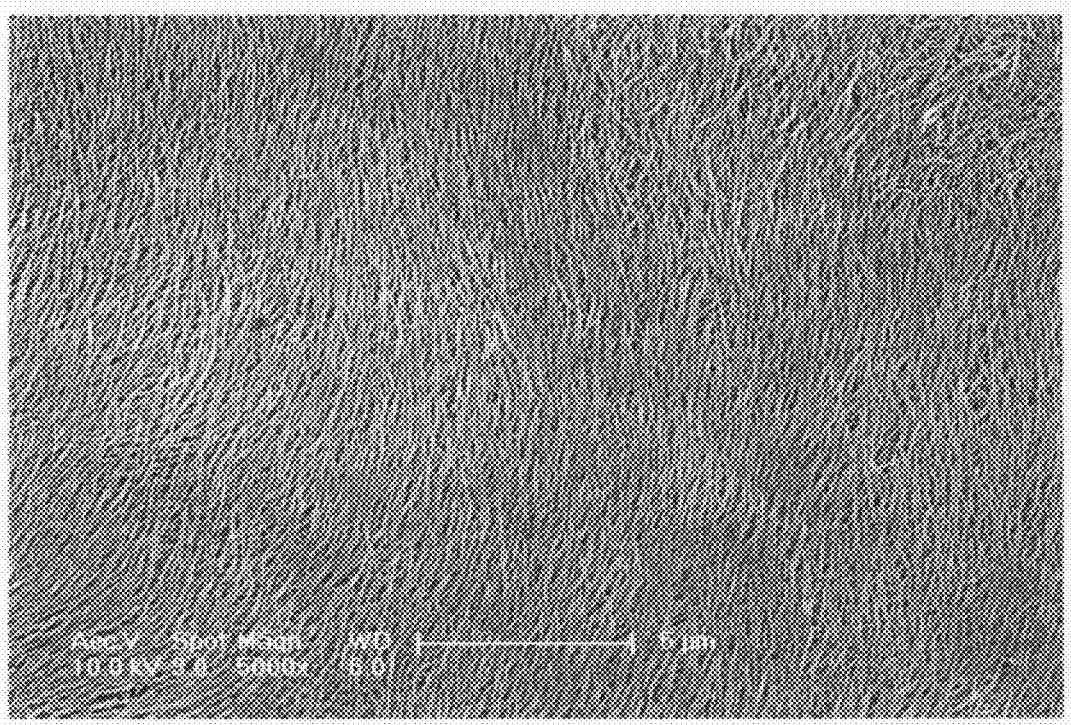
FIG. 2 shows a Scanning Electron Microscope (SEM) image of a carbon nanotube structure that can be utilized in the thin film transistor.

The carbon nanotube structure can be formed by pressing a carbon nanotube array. The angle is closely related to pressure applied to the carbon nanotube array. The greater the pressure, the smaller the angle. It is to be understood that the shape of the pressure head used to apply a pressure and the pressing direction can determine the direction of the carbon nanotubes arranged in each carbon nanotube film. When a pressure head (e.g. a roller) is used to travel across and press the array of carbon nanotubes along a predetermined single direction, a carbon nanotube film having a plurality of carbon nanotubes primarily aligned along a same direction is obtained. It can be understood that there may be some variation. The varying amounts of different alignment can be achieved. In FIG. 2, when the pressure head is used to travel across and press the array of carbon nanotubes several of times, variation will occur in the orientation of the nanotubes. Variations in pressure can also achieve different angles between the carbon nanotubes and the surface of the semiconducting layer on the same film.

When a roller-shaped pressure head is used to travel across and press the array of carbon nanotubes along different directions, a carbon nanotube film having a plurality of carbon nanotubes aligned along corresponding different directions is obtained. Specifically, the carbon nanotubes of one portion of the carbon nanotube structure are primarily arranged along a same direction, and the alignment direction of the carbon nanotubes of the portion is different from that of the carbon nanotubes of other portion.

When a planar pressure head is used to press the array of carbon nanotubes along a direction perpendicular to the applicable base, a carbon nanotube film which is isotropic can be obtained. The acquired carbon nanotube structure has good tensile strength, and can be formed into any desired shape. The carbon nanotubes in the carbon nanotube structure are parallel to the surface of the base of the carbon nanotube structure when the angle is 0 degrees. A length and a width of the carbon nanotube structure can be arbitrarily set as desired. A thickness of the carbon nanotube structure is in a range from about 0.5 nanometers to about 100 micrometers.

A length of the semiconducting layer 140 can be in a range from about 1 micrometer to about 100 micrometers. A width of the semiconducting layer 140 can be in a range from about 1 micrometer to about 1 millimeter. A thickness of the semiconducting layer 140 can be in a range from about 0.5 nanometers to about 100 micrometers. A length of the channel 156 can be in a range from about 1 micrometer to about 100 micrometers. A width of the channel 156 (e.g., a distance from the source electrode to the drain electrode) can be in a range from about 1 micrometer to about 1 millimeter.

In the present embodiment, the semiconductor layer 140 includes a carbon nanotube structure. The carbon nanotube structure includes a plurality of carbon nanotubes arranged along a same direction. The carbon nanotubes can be arranged along a preferred direction extending from the source electrode 151 to the drain electrode 152. Two ends of the carbon nanotube structures are electrically connected to the source electrode 151 and the drain electrode 152. The length of the semiconducting layer 140 of the present embodiment is about 50 micrometers, the width of the semiconducting layer is about 300 micrometers, and the thickness of the semiconducting layer 140 is about 25 nanometers. The length of the channel 156 is about 40 micrometers, and the width of the channel 156 is about 300 micrometers.

The source electrode 151, the drain electrode 152, and/or the gate electrode 120 are made of conductive material. In the present embodiment, the source electrode 151, the drain electrode 152, and the gate electrode 120 are conductive films. A thickness of the conductive film can be in a range from about 0.5 nanometers to about 100 micrometers. The material of the source electrode 151, the drain electrode 152, and the gate electrode 120 can be selected from the group consisting of metal, alloy, indium tin oxide (ITO), antimony tin oxide (ATO), silver paste, conductive polymer, or metallic carbon nanotubes. The metal or alloy can be selected from the group consisting of aluminum (Al), copper (Cu), tungsten (W), molybdenum (Mo), gold (Au), titanium (Ti), neodymium (Nd), palladium (Pd), cesium (Cs), and combinations of the above-mentioned metal. In the present embodiment, the source electrode 151, the drain electrode 152, and the gate electrode 120 are Pd films. A thickness of the Pd film is about 5 nanometers. The Pd films have good wettability with the carbon nanotube films.

The material of the insulating layer 130 can be a rigid material such as silicon nitride ($Si_3N_4$), silicon dioxide ($SiO_2$), or a flexible material such as polyethylene terephthalate (PET), benzocyclobutenes (BCB), polyester or acrylic resins. A thickness of the insulating layer 130 can be in a range from about 5 nanometers to about 100 microns. In the present embodiment, the insulating layer 130 is $Si_3N_4$.

Figure 3:
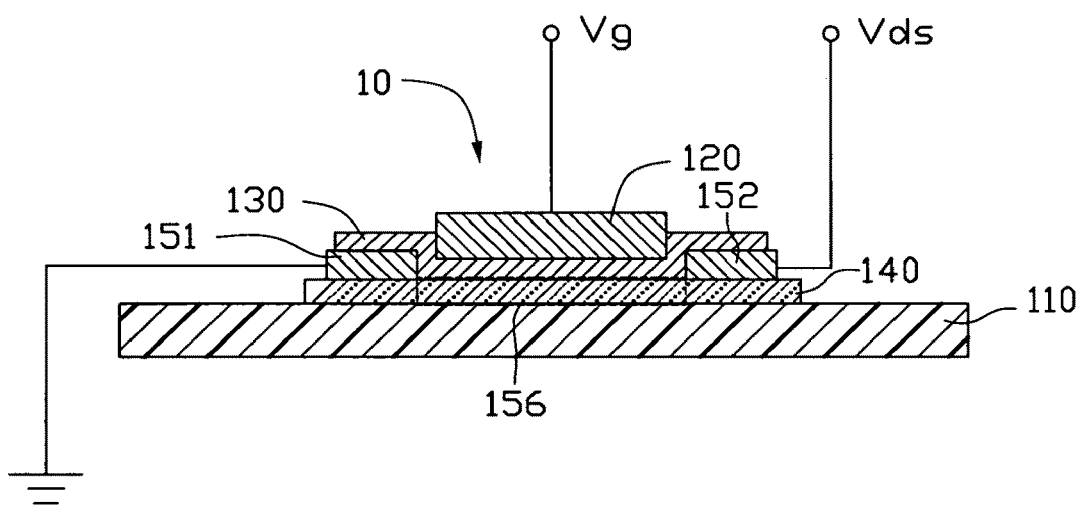
FIG. 3 is a schematic view of the thin film transistor of FIG. 1 connected to a circuit.

Referring to FIG. 3, in use, the source electrode 151 is grounded. A voltage Vds is applied to the drain electrode 152. Another voltage Vg is applied on the gate electrode 120. The voltage Vg forming an electric field in the channel 156 of the semiconducting layer 140. Accordingly, carriers exist in the channel near the gate electrode 120. As the Vg increasing, a current is generated and flows through the channel 156. Thus, the source electrode 151 and the drain electrode 152 are electrically connected. The carrier mobility of the semiconducting carbon nanotubes along the length direction thereof is relatively high, and the carbon nanotubes of the carbon nanotube structure are aligned from the source electrode 151 to the drain electrode 152. Therefore, the paths for the carriers to travel in the semiconducting layer 140 are short, resulting in high carrier mobility. In the present embodiment, the carrier mobility of the thin film transistor 10 is higher than 10 $cm^2/V^{-1}s^{-1}$ (e.g., 10 to 1500 $cm^2/V^{-1}s^{-1}$), and the on/off current ratio of the thin film transistor 10 is in a range from about $1.0\times10^2$ to about $1.0\times10^6$.

One way to obtain a carbon nanotube layer that has only semiconducting carbon nanotubes is executed by applying a voltage between the source electrode 151 and the drain electrode 152, to break down the metallic carbon nanotubes in the carbon nanotube layer 140, and thereby achieve a semiconducting layer free of metallic carbon nanotubes therein. The voltage is in a range from about 1 to about 1000 volts (V).

Figure 4:
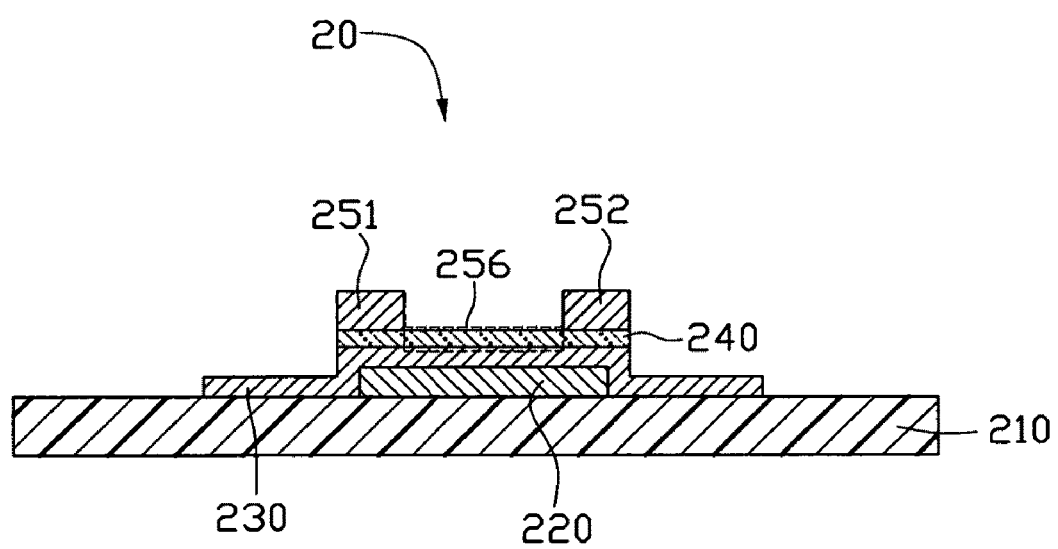
FIG. 4 is a cross sectional view of a thin film transistor in accordance with a second embodiment.

Referring to FIG. 4, a thin film transistor 20 is provided in a second embodiment and has a bottom gate structure. The thin film transistor 20 includes a gate electrode 220, an insulating layer 230, a semiconducting layer 240, a source electrode 251, and a drain electrode 252. The thin film transistor 20 is located on an insulating substrate 210.

The compositions, features and functions of the thin film transistor 20 in the second embodiment are similar to the thin film transistor 10 in the first embodiment. The difference is that, the gate electrode 220 of the second embodiment is located on the insulating substrate 210. The insulating layer 230 covers the gate electrode 220. The semiconducting layer 240 is located on the insulating layer 230, and insulated from the gate electrode 220 by the insulating layer 230. The source electrode 251 and the drain electrode 252 are spaced apart from each other and electrically connected to the semiconducting layer 240. The source electrode 251, and the drain electrode 252 are insulated from the gate electrode 220 by the insulating layer 230. A channel 256 is formed in the semiconducting layer 240 at a region between the source electrode 251 and the drain electrode 252.

The source electrode 251 and the drain electrode 252 can be located on the semiconducting layer 240 or on the insulating layer 230. More specifically, the source electrode 251 and the drain electrode 252 can be located on a top surface of the semiconducting layer 240, and at the same side of the semiconducting layer 240 with the gate electrode 220. In other embodiments, the source electrode 251 and the drain electrode 252 can be located on the insulating layer 230 and covered by the semiconducting layer 240. The source electrode 251 and the drain electrode 252 are at a different side of the semiconducting layer 240 from the gate electrode 220. In other embodiments, the source electrode 251 and the drain electrode 252 can be formed on the insulating layer 230, and coplanar with the semiconducting layer 240. The semiconducting layer 240 includes a plurality of carbon nanotubes.

The thin film transistors provided in the present embodiments have the following superior properties. Firstly, if the carbon nanotubes in the semiconducting layer result in a carrier mobility of the thin film transistor is relatively high. Secondly, the carbon nanotubes are tough and flexible. Thus, thin film transistors using metallic carbon nanotubes as electrodes are durably flexible. Thirdly, the carbon nanotubes are durable at high temperatures. Therefore, the thin film transistor using carbon nanotubes as the semiconducting layer can be used in high temperature. Fourthly, the thermal conductivity of the carbon nanotubes is relatively high, and the carbon nanotubes in the semiconducting layer rest upon each other. Thus, in use, heat produced by the thin film transistor can be rapidly spread out and easily dissipated.

It is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A thin film transistor comprising:
   a source electrode;
   a drain electrode spaced from the source electrode;
   a semiconductor layer comprising a carbon nanotube structure, the carbon nanotube structure comprises of carbon nanotubes; and
   a gate electrode insulated from the source electrode, the drain electrode, and the semiconducting layer by an insulating layer,
   wherein the carbon nanotube structure is connected to both the source electrode and the drain electrode, an angle exist between each carbon nanotube of the carbon nanotube structure and a surface of the semiconductor layer, and the angle ranges from about 0 degrees to about 15 degrees.

2. The thin film transistor of claim 1, wherein the carbon nanotubes in the carbon nanotube structure are primarily arranged along a same direction.

3. The thin film transistor of claim 1, wherein the carbon nanotube structure is isotropic.

4. The thin film transistor of claim 1, wherein the carbon nanotubes of the carbon nanotube structure are primarily arranged along two or more different directions.

5. The thin film transistor of claim 1, wherein the carbon nanotubes rest upon each other.

6. The thin film transistor of claim 1, wherein the carbon nanotubes are semiconducting carbon nanotubes.

7. The thin film transistor of claim 1, wherein the plurality of carbon nanotubes are primarily arranged along a direction extending from the source electrode to the drain electrode.

8. The thin film transistor of claim 1, wherein the carbon nanotubes are selected from a group consisting of the single-walled carbon nanotubes, double-walled carbon nanotubes, and combinations thereof.

9. The thin film transistor of claim 1, wherein a diameter of each of the carbon nanotubes is less than 10 nanometers.

10. The thin film transistor of claim 1, wherein the insulating layer is located between the semiconductor layer and the gate electrode, and the material of the insulating layer comprises of a material that is selected from the group consisting of silicon nitride, silicon dioxide, benzocyclobutene, polyester and acrylic resin.

11. The thin film transistor of claim 1, wherein the source electrode, the drain electrode, and the gate electrode comprise of one or more materials selected from the group consisting of metal, alloy, indium tin oxide, antimony tin oxide, silver paste, conductive polymer, and metallic carbon nanotube.

12. The thin film transistor of claim 11, wherein the metal is selected from the group consisting of aluminum, copper, tungsten, molybdenum, gold, titanium, neodymium, palladium, cesium, and alloy thereof.

13. The thin film transistor of claim 1, wherein the semiconductor layer is located on an insulating substrate, the source electrode and the drain electrode are located on the semiconductor layer, the insulating layer is located on the semiconducting layer, and the gate electrode is located on the insulating layer.

14. The thin film transistor of claim 13, wherein a material of the insulating substrate comprises of a material that is selected from a group consisting of silicon nitride, silicon dioxide, polyethylene terephthalate, benzocyclobutenes, and acrylic resins.

15. The thin film transistor of claim 1, wherein the gate electrode is located on an insulating substrate, the insulating layer is located on the gate electrode, the semiconducting layer is located on the insulating layer, the source electrode and the drain electrode are located on an surface of the semiconducting layer.

16. The thin film transistor of claim 1, the thin film transistor has a carrier mobility ranging from about 10 to about 1500 $cm^2/V^{-1}s^{-1}$, and an on/off current ratio ranging from about $1.0\times10^2$ to about $1.0\times10^6$.

17. The thin film transistor of claim 1, wherein the semiconductor layer further comprises a channel located between the source electrode and the drain electrode.

18. The thin film transistor of claim 17, wherein the length of the channel is in a range from about 1 micrometer to about 100 micrometers, a width of the channel is in a range from about 1 micrometer to about 1 millimeter, and a thickness of the channel is in a range from about 0.5 nanometers to about 100 micrometers.

19. A thin film transistor comprising:
a source electrode;
a drain electrode spaced from the source electrode;
a semiconductor layer comprising a carbon nanotube structure, the carbon nanotube structure comprises of semiconducting carbon nanotubes; and
a gate electrode insulated from the source electrode, the drain electrode, and the semiconducting layer by an insulating layer,
wherein the carbon nanotube structure comprises an overlapping structure, and the carbon nanotubes connect the source and the drain electrode, and the carbon nanotubes are aligned in a direction that parallel to the shortest path from the source electrode to the drain electrode.

* * * * *